United States Patent
Takayama

(10) Patent No.: US 6,731,679 B1
(45) Date of Patent: May 4, 2004

(54) MODULATOR/DEMODULATOR AND METHOD OF MODULATION/ DEMODULATION USED FOR SAME

(75) Inventor: Yoshikazu Takayama, Tokyo (JP)

(73) Assignee: NEC Corporation, Tokyo (JP)

( * ) Notice: Subject to any disclaimer, the term of this patent is extended or adjusted under 35 U.S.C. 154(b) by 709 days.

(21) Appl. No.: 09/583,980

(22) Filed: May 31, 2000

(30) Foreign Application Priority Data

Jun. 1, 1999 (JP) .......................................... 11-153737

(51) Int. Cl.$^7$ ................................................ H04B 1/38
(52) U.S. Cl. ........................ 375/223; 375/280; 375/284; 375/261
(58) Field of Search ................................ 375/222, 331, 375/329, 330, 223, 261, 279, 280, 281, 283, 284; 379/93.01; 370/503, 523

(56) References Cited

U.S. PATENT DOCUMENTS 5,574,448 A * 11/1996 Weng et al. .................. 341/59
6,173,020 B1 * 1/2001 Nishimura .................. 375/324

OTHER PUBLICATIONS

Ungerboeck; "Trellis–Coated Modulation with Redundant Signal Sets"; Communications Magazine IEEE; vol. 25, No. 2; Feb. 1987; pp. 5–21.

* cited by examiner

Primary Examiner—Don N. Vo
(74) Attorney, Agent, or Firm—Foley & Lardner

(57) ABSTRACT

A modulator converts an inputted data to be transmitted into a septenary data, modulates a carrier by the converted data, and transmits the modulated carrier via an antenna. A demodulator demodulates a received data supplied from the antenna into an octonary data, which is converted into a septenary data. According to the structure, a vector representing the modulated carrier is prevented from passing a "O" point when a phase shift of the modulate carrier occurs.

10 Claims, 7 Drawing Sheets

FIG.6

CONVERSION TABLE USED IN CASE THAT DIFFERENTIAL CONVERSION IS CONDUCTED

Figure 1:
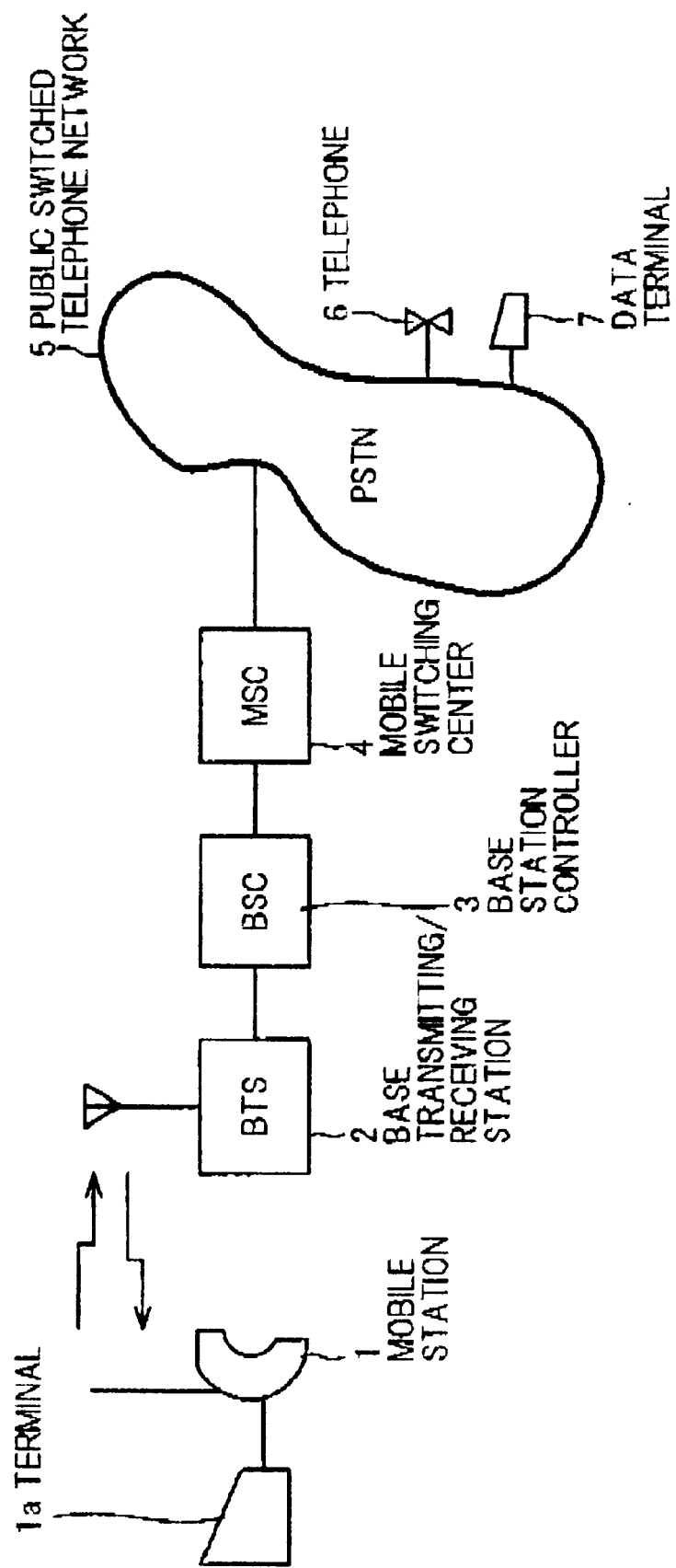

| OLD / NEW | 0 | 1 | 2 | 3 | 4 | 5 | 6 | 7 |
|---|---|---|---|---|---|---|---|---|
| 0 | 0 | 1 | 2 | 3 | 4 | 5 | 6 | 7 |
| 1 | 1 | 2 | 3 | 4 | 5 | 6 | 7 | 0 |
| 2 | 2 | 3 | 4 | 5 | 6 | 7 | 0 | 1 |
| 3 | 3 | 4 | 5 | 6 | 7 | 0 | 1 | 2 |
| 4 | 5 | 6 | 7 | 0 | 1 | 2 | 3 | 4 |
| 5 | 6 | 7 | 0 | 1 | 2 | 3 | 4 | 5 |
| 6 | 7 | 0 | 1 | 2 | 3 | 4 | 5 | 6 |

OLD : DATA OF ADJACENTLY PRECEDING SYMBOL
NEW : NEWLY INPUTTED DATA

MODULATOR/DEMODULATOR AND METHOD OF MODULATION/ DEMODULATION USED FOR SAME

FIELD OF THE INVENTION

The invention relates to a modulator/demodulator for a 7 PSK system which transmits data at a higher speed than that of a π/4 shift QPSK system and a method of modulation/demodulation used for the same.

BACKGROUND OF THE INVENTION

It is well known that a QPSK modulation system is widely used in various communication systems. In the QPSK modulation system, a single modulation signal can transmit information of 2 bits.

In the QPSK system, a single modulated carrier is selected from four modulated carriers, phase angles of which are successively shifted by π/4 in accordance with information of 2 bits supplied to a modulator.

In the QPSK system, when a phase shift of 180° occurs, a vector representing a modulated carrier passes an origin (a "O" point) In case that such a phase shift occurs, since an envelope of a QPSK wave greatly changes when it is outputted from a filter, the QPSK wave is much affected by nolinearity of the power amplifier.

As a method in which an effect of nonlinearity of the power amplifier is not so much, a π/4 shift QPSK system can be cited.

According to the π/4 shift QPSK system, a single modulation signal can transmit information of 2 bits similarly to the QPSK system.

The π/4 shift QPSK system has 8 signal points phase angles of which are successively shifted by π/4 on a circle representing a phase and an amplitude of the carrier. In this system, since a variation of the envelope is small, a bandwidth of the modulated carrier is narrow when it Is outputted from the filter, and the effect of nonlinearity of the power amplifier is not so much.

As a modulation system in which a single modulation signal can transmit information of more than 2 bits, a trellis-coded 8PSK modulation system (G. Unger boeck "Trellis-coded modulation with redundant signal sets, Part I and II", IEEE Communication Magazine, Vol.25, No.2, pp.5 to 21, February, 1987) is known besides the QPSK system and the π/4 shift QPSK system.

In the aforementioned system, redundant signal sets are added to an information signal of 2 bits by the trellis-coder to output data of 3 bits, and the data thus obtained are supplied to a 8PSK modulator, in which one of 8 modulation signal points having phase angles successively shifted by π/4 is selected and a carrier having a phase angle corresponding to the selected modulation signal point is outputted.

In a PDC (Personal Digital Celluar)system, which outputs 112 symbols and information of 224 bits in a burst, a bit rate thereof is 11.2 kps in a case of full rate. As mentioned in the above, since the bit rate is quite low, an improvement of the transmission speed of the PDC system is in great demand. Since the aforementioned π/4 shift QPSK system uses a similar phase/amplitude to that used in the trellis-coded 8PSK system, if the data is transmitted through a 8PSK system, it is expected that transmission speed will be remarkably improved.

However, in the aforementioned trellis-coded 8PSK modulation system, the vector representing the modulated carrier may pass the zero "O" point at the time of a phase shift thereof, and the amplitude of the envelope of the modulated carrier may be zero. As mentioned in the above, if such a phase shift occurs, the envelope of the QPSK wave is sharply changed when it is outputted from the output filter, and the QPSK wave is much affected by the nonlinearity of the power amplifier.

In order to overcome the aforementioned difficulty, it is necessary that a dynamic range of the power amplifier extends from zero to a rated value, hence a cost of the system becomes extremely high.

SUMMARY OF THE INVENTION

Accordingly, it is an object of the invention to provide a modulator/demodulator which can transmit a data at a high speed without an increase in cost.

It is a further object of the invention to provide a method of modulation/demodulation used in a modulatioor/demodulator which transmits a data at a high speed without an increase in cost.

According to the first feature of the invention, a modulator/demodulator comprises:

a modulator which converts an first inputted data into a septenary data, modulates a carrier by the converted data, and radiates the modulated carrier via an antenna, and a demodulator which demodulates a second inputted data supplied from the antenna into an octonary data, and converts the octonary data into a septenary data.

The modulator may comprise:

the first convertor for converting the inputted binary data into the septenary date in which each symbol is seven valued, the second convertor for converting the septenary data into an octonary data in which each symbol is eight valued by adding a dummy to the each seven valued symbol, a quadrature convertor for conducting a quadrature conversion of the octonary data to separate an output of the quadrature convertor into I and Q components, and a quadrature modulator for modulating carries with a phase difference of π/2 by the I and Q components.

The second convertor may conduct a differential conversion in case that the septenary data is converted into the octonary data so that a vector representing a modulated carrier is prevented from passing a zero point at the time of a phase shift of the modulated carrier.

The first convertor may convert the binary data into the septenary data in terms of 5 symbols or 31 symbols.

The demodulator may comprise:

the first and second mixers for respectively mixing the second inputted data supplied from the antenna wish local carriers with a phase difference of π/2, the first and second low pass filters for respectively removing high frequency components contained in outputs of the first and second mixers.

an inverse quadrature convertor for demodulating outputs of the first and second low pass filters to derive an octonary data functioning as a 8QAM data, the third convertor for converting the octonary data outputted from the quadrature demodulator into a septenary data, and the fourth convertor for converting the septenary data outputted from the third convertor into a binary data.

According to the second feature of the invention, a method of modulation/demodulation used in a modulator/demodulator comprises:

the first step comprising the steps of converting an inputted data into a septenary data, modulating a carrier by the converted data, and radiating the modulated carrier via an antenna, and the second stop comprising the steps of demodulating a received data supplied from the antenna into a octonary data, and converting the octonary data into a septenary data.

The first step may comprise the step of converting the inputted binary data into the septenary data in which each symbol is seven valued, converting the septenary data into an octonary data in which each symbol is eight valued by adding a dummy to the each seven valued symbol, conducting a quadrature conversion of the octonary data to derive I and Q components, and modulating carriers with a phase difference of $\pi/2$ by the I and Q components.

The step of converting the septenary data into an octonary data may comprise the step of conducting differential conversion in case that the septenary data is converted into the octonary data so that a vector representing a modulated carrier is prevented from passing a zero point at the time of a phase shift of the modulated carrier.

The step of converting the inputted binary data into the septenary data may comprise the step of converting the inputted binary data into the septenary data in terms of 5 symbols or 31 symbols.

The second step may comprise the steps of:

mixing the received data with local carriers with a phase difference of $\pi/2$ by means of first and second mixers, removing high frequency components contained in outputs of the first and second mixers, demodulating output signals of the first and second mixers from which the high frequency components are removed to derive an octonary data functioning as a 8QAM data, converting the octonary data into a septenary data, and converting the septenary data into a binary data.

In a modulator/demodulator and a method of modulation/demodulation used in the same, a vector representing a modulated carrier is prevented from passing a zero point by converting the first inputted data into a septenary data, modulating a carrier by the converted data, and radiating the modulated carrier via an antenna in a modulator, and by demodulating the second inputted data supplied from the antenna into an octonary data, and converting the octonary data into a septenary data in the demodulator.

BRIEF DESCRIPTION ON APPENDED DRAWINGS

Figure 2:
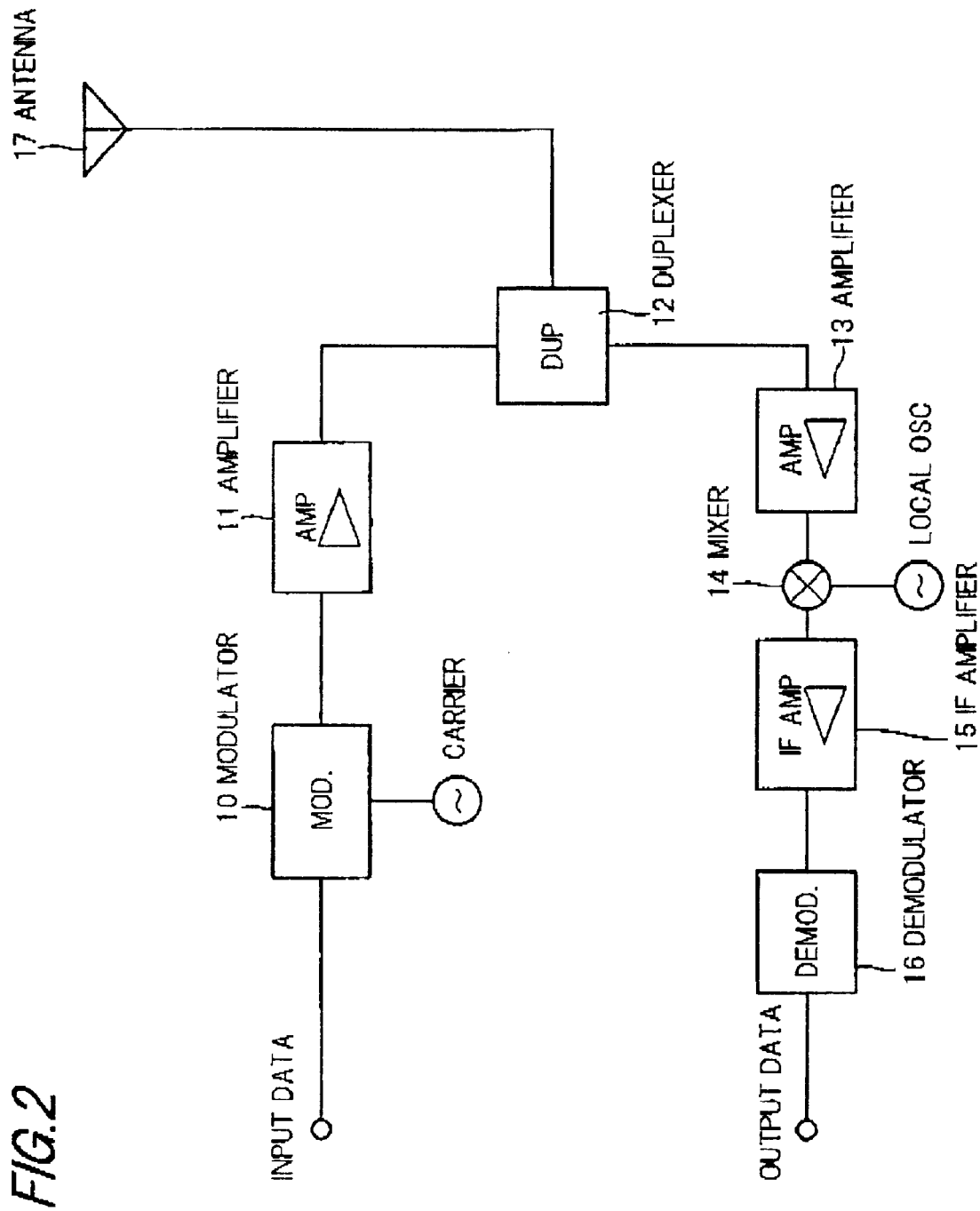
Figure 3:
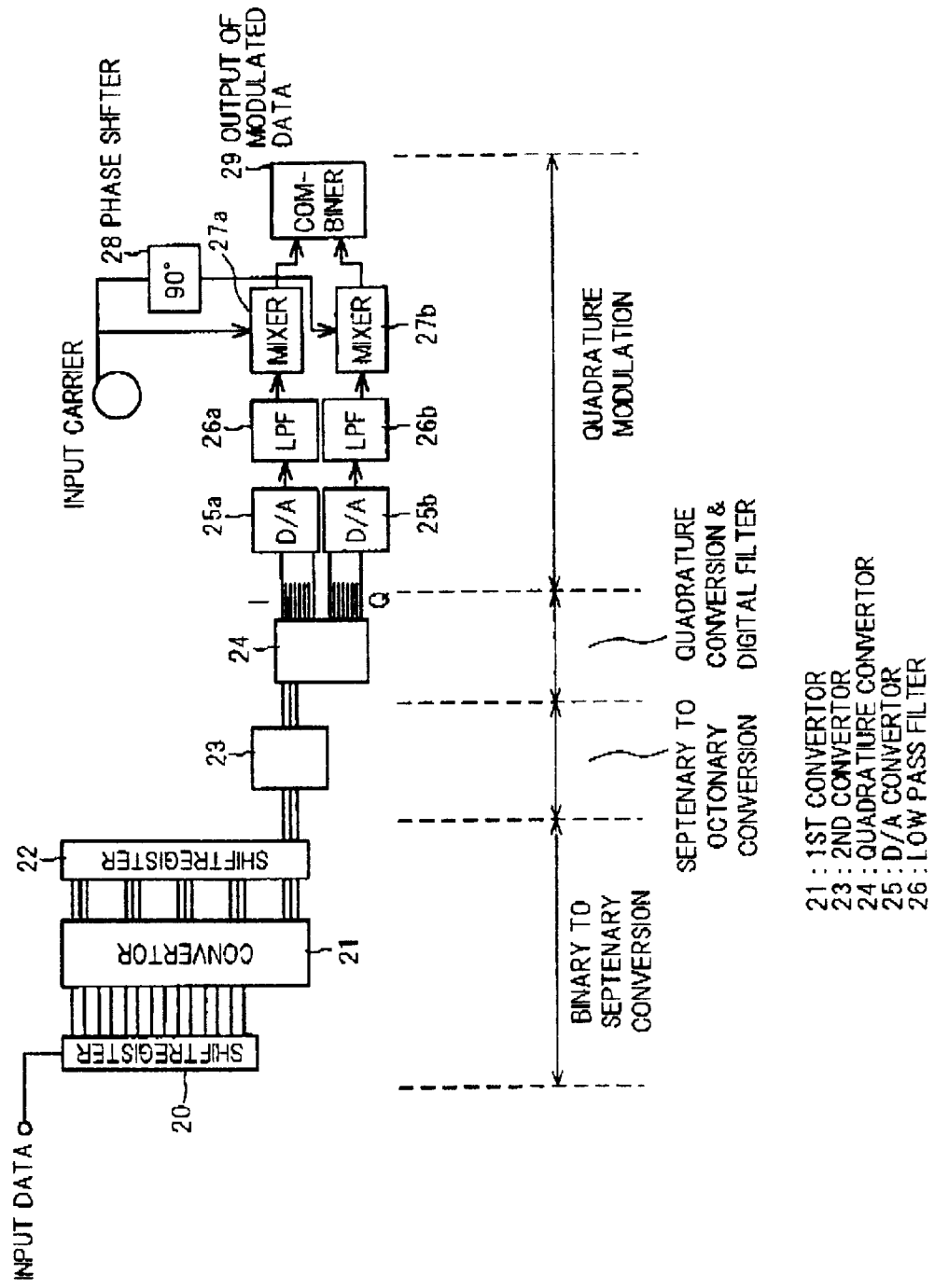
Figure 4:
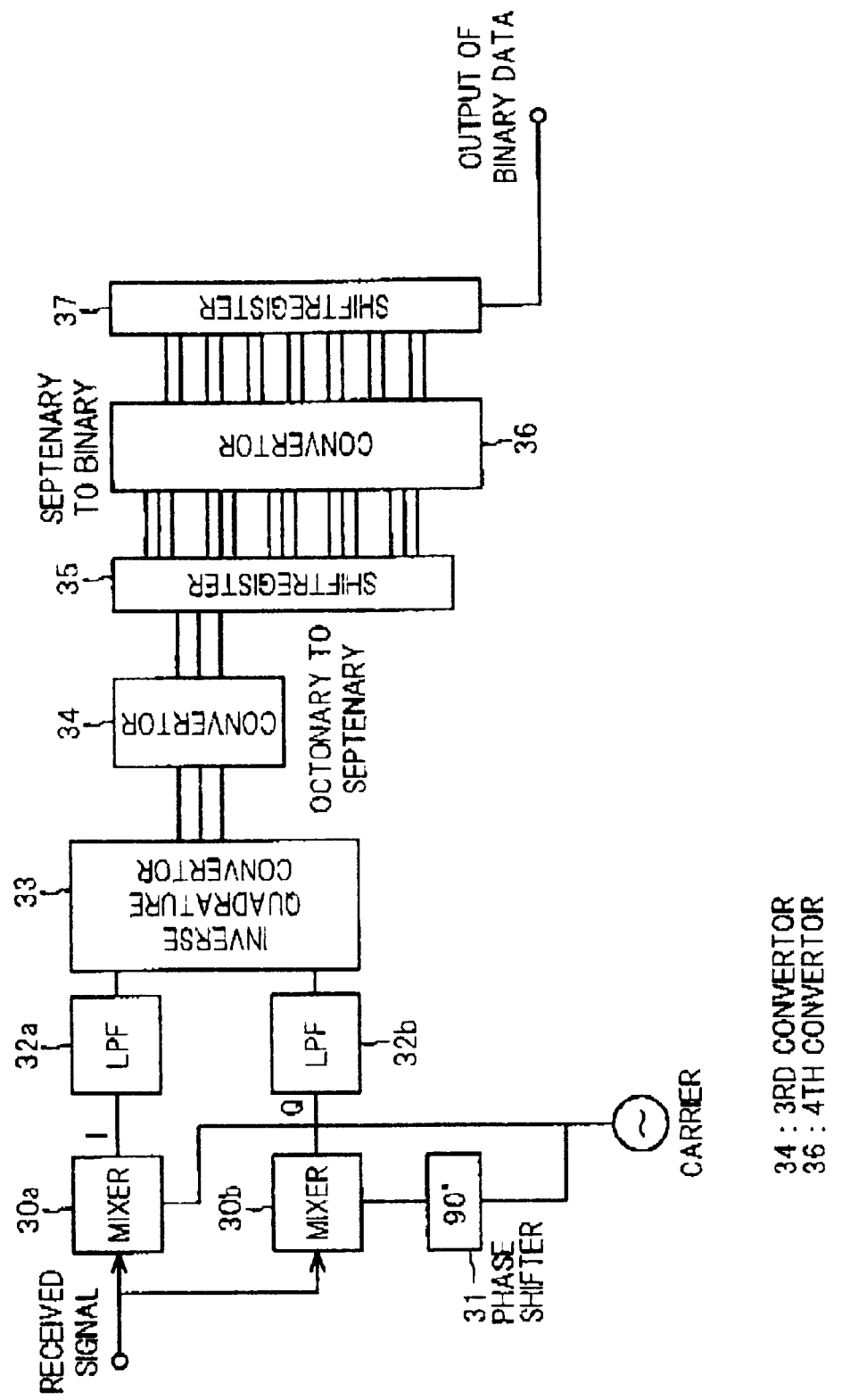
Figure 5:
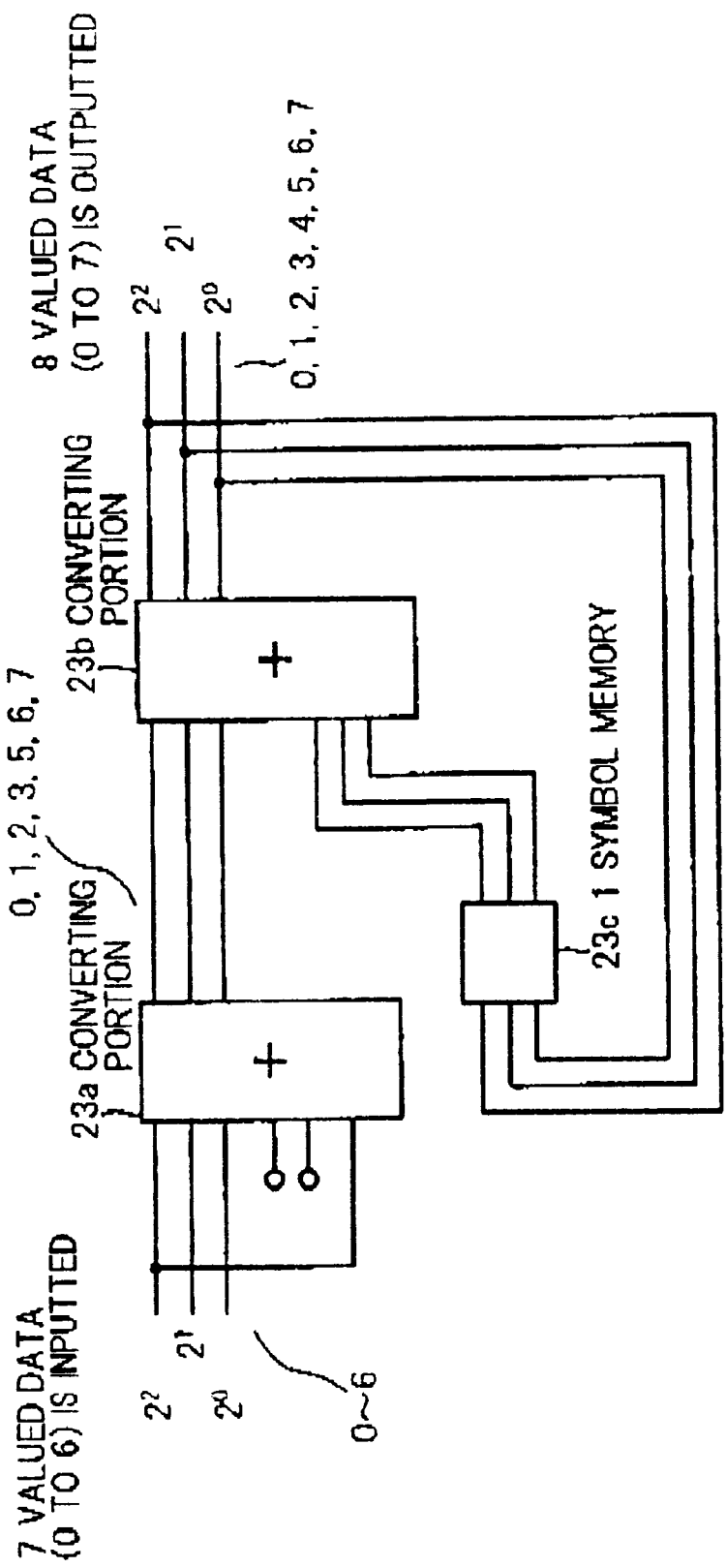
Figure 7:
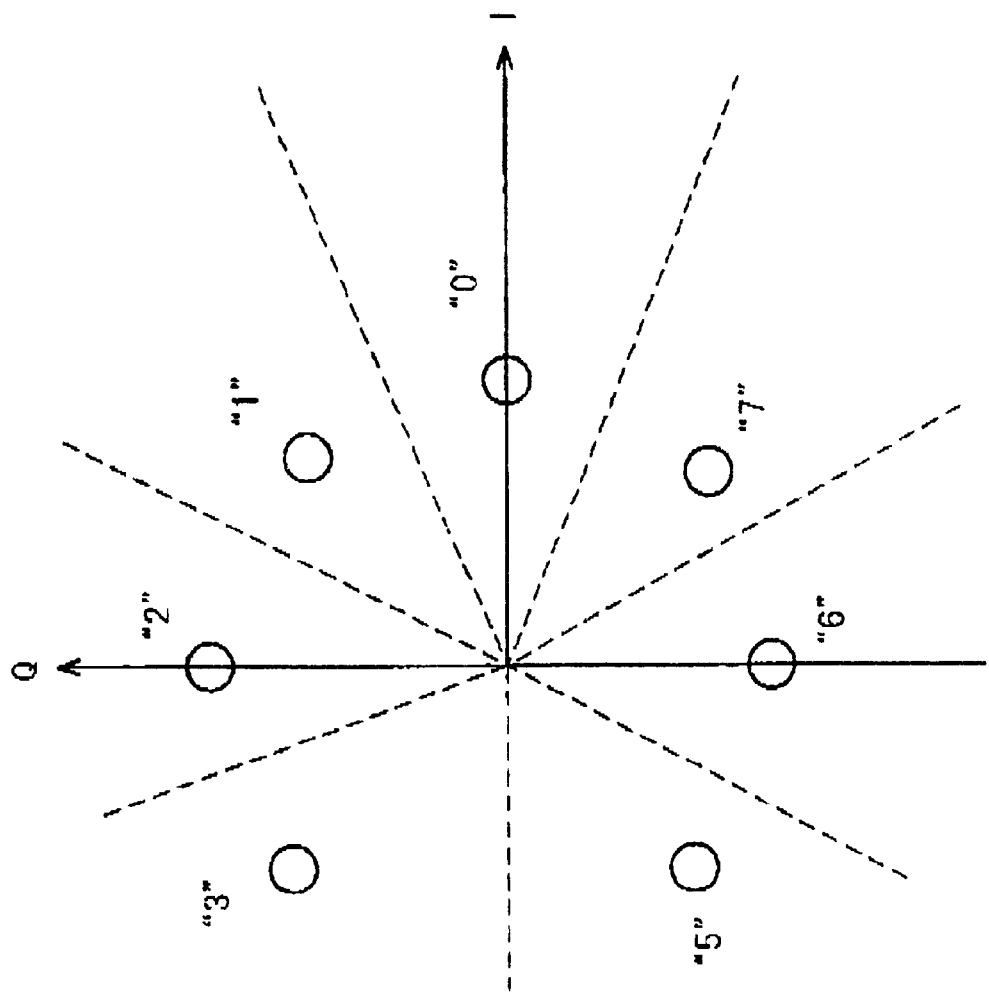

The invention will be explained in more detail in conjunction with appended drawings, wherein:

FIG. 1 is a block diagram for showing a mobile communication system comprising a modulator/demodulator according to a preferred embodiment of the invention, FIG. 2 is a block diagram for showing a wireless apparatus of a mobile station (MS) shown in FIG. 1, FIG. 3 is a block diagram for showing a modulator shown in FIG. 2 in detail, FIG. 4 is a block diagram for showing a demodulator shown in FIG. 2 in detail, FIG. 5 shows a structure of a convertor shown in FIG. 3 in detail, FIG. 6 shows a conversion table used in case that a differential conversion is conducted, and FIG. 7 shows an example of representation of phase discrimination on a polar coordinate of a demodulator shown in FIG. 2.

DESCRIPTION OF THE PREFERRED EMBODIMENTS

Hereafter, an embodiment of the invention will be explained.

A mobile communication system shown in FIG. 1 are provide with a mobile station (MS)1, a base transmitting/receiving station (BTS)2, abase station controller (BSC)3, a mobile switching center (MSC)4, a public switched telephone network (PSTN)5, a telephone 6 and a data terminal 7.

The PSTN 5 is usually connected with the base transmitting/receiving station (BTS) 2 by a wire system. The mobile station (MS) 1 is usually connected with the base transmitting/receiving station (BTS) 2 by a wireless system.

When a data is transmitted, a terminal 1a connected with the mobile station (MS) 1 in used.

A wireless apparatus of the mobile station (MS)1 is shown in detail in FIG. 2.

The wireless apparatus of the mobile station (MS) 1 is provided with a modulator 10, an amplifier 11, a duplexer 12, an amplifier 13, a mixer 14, an intermediate wave amplifier (an IF amplifier, hereafter) 15, a demodulator 16 and an antenna 17.

The modulator 10 serving as modulating means converts an aural signal or a binary data into a septenary data, which modulates a carrier. The amplifier 11 amplifies an output of the modulator 10 up to a predetermined level. The duplexer 12 transmits the signal amplified by the amplifier 11 via the antenna 17.

The amplifier 13 amplifies a signal supplied thereto via the antenna 17 and the duplexer 12 up to a predetermined level. The IF amplifier 15 amplifies an IF signal outputted from the mixer 14. The modulator 16 serving as modulating means demodules the IF signal outputted from the IF amplifier 15. Moreover, the demodulator 16 demodulates an inputted aural signal or a digital data into an octonary data, and again convert into a septenary data.

The detailed structure of the modulator 10 is shown in FIG. 3.

The modulartor 10 is provided with a shiftregister 20, a convertor 21, a shiftregister 22, a convertor 21, a quadrature convertor 24, D/A convertors 25a, 25b, LPFs 26a, 26b, mixers 27a, 27b, a 90° phase shifter 28 and a combiner 29.

The shiftregister 20 serving as the first shiftregister 20 is the register of 14 bits and sets the inputted data. The convertor 21 serving as the first convertor converts a binary data into a septenary data. This process is equivalent to convert a binary number into a septenary number. The shiftregister 22 serving as the second shiftregister sets the data converted by the convertor 21.

The convertor 23 serving as the second convertor converts a septenary data into an octonary data. That is to say, each of 7 valued symbols composing the septenary data is supplied with a dummy to form a 8 valued symbol. Moreover, when the convertor 23 converts the septenary data into the octonary data, the convertor 23 conducts a differential conversion so that a vector representing the modulated carrier is prevented from passing the origin (the "O" point) similarly to the π/4 shift QPSK system. It should be noted that, although the output data of the convertor 23 is octonary physically, this data is septenary logically.

The quadrature convertor 24 conducts quadrature conversion of the octonary data outputted from the convertor 23, and separates the converted data into I and Q components. The quadrature convertor 24 outputs filtered data.

The D/A convertors 25a, 25b convert the digital data supplied from the quadrature convertor 24 into analog signals. The LPFs 26a, 26b remove high frequency components contained in the analog signals.

The mixer 27a mixes the analog signal passing through the LPF 26a with a carrier straightly supplied to the mixer 27a. The mixer 27b mixes the analog signal passing through the LPF 26b with a carrier supplied to the mixer 27b via the 90° phase shifter 28. The combiner 29 combines the outputs of the mixers 27a, 27b.

FIG. 4 shows the structure of the demodulator 16 in details.

The demodulator 16 is provided with mixers 30a, 30b, a 90° phase shifter 31, LPFs 32a, 32b, an inverse quadrature convertor 33, a convertor 34, a shiftregister 35, a convertor 36 and a shiftregister 37.

The mixer 30a mixes a received signal with a local carrier directly supplied to the mixer 30a. The mixer 30b mixes a received signal with the local carrier which is supplied to the mixer 30b via the 90° phase shifter 31. The LPFs 32a, 32b respectively removes high frequency components contained in outputs of the mixers 30a, 30b. The inverse quadrature convertor 33 demodulates output signals of the LPFs 32a, 32b into a 8QAM signal.

The convertor 34 serving as the third convertor converts the octonary data outputted from the inverse quadrature convertor 33 into the septenary data. Moreover, the convertor 34 conducts the differential conversion. The shiftregister 35 serving as the third shift register sets the septenary data converted by the convertor 34.

The convertor 36 serving as the fourth convertor converts the septenary data set by the shiftregister 35 into the binary data. The shiftregister 37 serving as the fourth shiftregister is a shiftregister of 14 bits, and sets and outputs the binary data converted by the convertor 36.

The convertor 23 shown in FIG. 3 which converts the septenary data into the octonary data is shown in FIG. 5 minuttely. Moreover, FIG. 6 shows a conversion table used in case that the differential conversion is conducted.

As shown in FIG. 5, when a 7 valued data of (0 to 6) is inputted a converting portion 23a outputs a data of (0,1,2,3,5,6,7). A data of (0,1,2,3,4,5,6,7) is outputted by the converting portion 23b as a 8 valued data of (0 to 7). At this time, the converting portion 23b is supplied with one symbol from an one symbol memory 23c.

FIG. 7 shows an example of a representation of phase discrimination on a polar coordinate of the demodulator 16 shwon FIG. 2. In FIG. 7, the phase angle of the septenary data is directly discriminated without being demodulated into an octonary data. If this phase discriminator having a phase discrimination characteristic shown in FIG. 7 is put to practical use, it is situated in the position of the convertor 34 in FIG. 4. It should be noted that FIG. 7 shows an example of phase discrimination in case that an adjacently preceding symbol represents "O".

Next, an operation of a modulator/demodulator having the aforementioned structure will be explained.

Firs,a binary data is converted into a septenary data by means of the convertor 21 shown in FIG. 3.

In case that the septenary system is introduced in order to improve the efficiency in the data transmission of the PDC system, although it is the simplest way to represent each symbol of the septenary data in the binary data, the number of bits necessary for the aforementioned process becomes too large.

In order to convert the binary data into the septenary data, the binary data is divided into plural sections composed of 14 bits, and each section is represented by a sum of the 0th to the 4th power of 7 on a following condition. That is to say, this problem is equivalent to find coefficients $S_0$ to $S_4$ in the right side of the following equation.

$$B_c \times 2^0 + B_1 \times 2^1 + B_2 \times 2^2 + \ldots + B_{13} \times 2^{13} =$$

$$S_0 \times 7^0 + S_1 \times 7^1 + S_2 \times 7^2 + S_3 \times 7^3 + S_4 \times 7^4,$$

wherein each of $B_c$ to $B_{13}$ is 0 or 1, and each of $S_c$ to $S_4$ is 0 to 6. Since $2^{14} < 7^5$. $S_0$ to $S_4$ satisfying the above equation exist.

The convertor 23 shown in FIG. 3 converts the septenary data (the 7 valued data) into the octonary data {the 8 valued data} by the differential conversion so that the converted data has a similar characteristic to the π/4 shift QPSK system.

The septenary data is arranged on a polar coordinate of FIG. 7 as shown in table 1, and it should be noted that a point X is not used in this case.

TABLE 1

```
       ＼  ｜ ／
        ＼ ｜／
      3   2  1
       ＼ ｜ ／
    ---X---*---0----
       ／ ｜ ＼
      4   5  6
        ／｜＼
       ／ ｜ ＼
```

| 7 VALUED DATA | 0 | 1 | 2 | 3 | 4 | 5 | 6 |
|---|---|---|---|---|---|---|---|
| CHANGE OF PHASE ANGLE | +0° | +45° | +90° | +135° | +225° | +270° | +315° |
| 8 VALUED DATA | 0 | 1 | 2 | 3 | 5 | 6 | 7 |

A data represented on Table 1 is coded as a deviation from that of the edjacently preceding symbol. The aforementioned representation on the polar coordinated correspond to a case where the data of the adjacently preceding symbol is "O".

In this embodiment, since the point denoted by X is not used and the vector representing the modulated carrier does not pass the origin on which an amplitude thereof becomes zero, a dynamic range of the amplitude of the envelope is the same as that of the π/4 shift QPSK system.

A represantaion on a polar coordinate shown in Table 2 shows a case where a phase angle of the data of the adjacaently preceding symbol is 45°. Similarly to the case of Table 1, the vector representing the modulated carrier does not pass the origin on which the amplitude thereof becomes zero.

TABLE 2

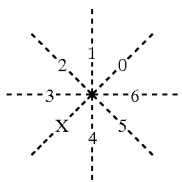

In this way, the septenary data having values of 0 to 6 can be converted into the octonary data having values of 0 to 7.

The physical arrangements of the phase and the amplitude of the π/4 shift QPSK system is the same as that of the 8 PSK (8QAM) system. Accordingly, a modulation/demodulation of the system according to the invention can be conducted similarly to the π/4 shift QPSK system.

As mentioned in the above, when the septenary system is introduced, the data of 14 bits can be transmitted by 5 symbols, and a high speed data transmission becomes possible.

If the binary data is converted into the septenary data, since (56+56) symbols can be transmitted by a single burst in the PDC system, (5×11+1+5×11+1) symbols can be transmitted by a single burst. In the first half of the single burst, 5 symbols carrying 14 bits are repeatedly transmitted 11 times, and a remaining symbol carrying 2 bits is transmitted one time independently of the former.

Since the last symbol is independent of the other symbols, a data transmitted thereby is limited to 2 bits. Accordingly, this data may be transmitted by the π/4 shift QPSK system.

Since the remaining 56 symbols in the second half of the burst can be treated similarly to the above description, 14×11+2+14×11+2=312 bits can be transmitted by the single burst.

In the conventional PDC system, since one symbol carries 2 bits and 2×(56+56)=224 bits are transmitted by a single burst, the efficiency of the data transmission can be improved by a factor of 1.39 according to the aforementioned system.

In order to further improve the efficiency of the data transmission, a following method can be devised.

Though 14 bits are converted into 5 symbols in the aforementioned system, if 87 bits are converted into 31 symbols, the efficiency of the data transmission is further improved.

It is due to the relation that $2^{67}<7^{31}$. Accordingly, the number of the symbols transmitted by a single burst can be written as 56+56=31+5×5+31+5×5, and the binary data transmitted by the single burst is given as 8+14×5+87+14×5=314 bits, hence it is clarified that 314 bits can be transmitted by 112 symbols.

If the bursts are transmitted at an interval of 20 ms, the data transmission speed becomes 15.7 kbps according to the aforementioned system.

In the PDC system, 112 symbols are transmitted by a single burst. When the septenary system is introduced in order to improve the efficiency of the data transmission, N bits can be transmitted by a single burst at the most, wherein N is a positive integer satisfying a following inequality that $2^N<7^{112}$, hence N is given as 314.

In order to realize the aforementioned system, it is necessary to convert 314 bits into a septenary number of 112 figures. Since 314 bits in a quite larger number, extensive calculation becomes necessary, and hardware therefor and software to be processed become massive.

In the system according to the invention, since the binary data is converted into the septenary data in terms of 5 symbols and 31 symbols, and 31 symbols can be represented as only 87 bits, the process is simplified.

As mentioned in the above, according to the aforementioned embodiment, since the modulator 10 converts the inputted data to be transmitted into the septenary data and modulates the carrier by the converted data, and the demodulator 16 demodulates the inputted data received via the antenna into the octonary data and converts the demodulated data into the septenary data, the vector representing the modulated carrier is prevented from passing the "O" point in case that the phase shift of the modulated carrier occurs, and the speed of the data transmission can be increased without bringing about an increase in cost.

Moreover, since the convertor 21 converts the binary data into the septenary data in terms of 5 symbols or 31 symbols, the process can be simplified.

As mentioned in the above, according to the modulator/demodulator and the method of modulation/demodulation used in the same, since the modulator converts the inputted data to be transmitted into the septenary data and modulates the carrier by the converted data, and the demodulator demodulates the inputted data received via the antenna into the octonary data and converts the demodulated data into the septenary data, the vector representing the modulated carrier is prevented from passing the "O" point in case that the phase shift of the modulated carrier occurs, and the speed of the data transmission can be increased without bringing about an increase in cost.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A modulator/demodulator, comprising:
   a modulator which converts an first inputted data into a septenary data, the septenary data to octonary data and the octonary data to quadrature data and modulates a carrier by said converted data and radiates said modulated carrier via an antenna, and
   a demodulator which demodulates a second inputted data supplied from said antenna via an inverse quadrature converter into an octonary data, and converts said octonary data into a septenary data.

2. A modulator/demodulator according to claim 1, wherein:
   said modulator comprises:
   a first convertor for converting said inputted binary data into said septenary data in which each symbol is seven valued,
   a second convertor for converting said septenary data into an octonary data in which each symbol is eight valued by adding a dummy to said each seven valued symbol,
   a quadrature convertor for conducting a quadrature conversion of said octonary data to separate an output of said quadrature convertor into I and Q components, and
   a quadrature modulator for modulating carries with a phase difference of π/2 by said I and Q components.

3. A modulator/demodulator according to claim 2, wherein:
   said second convertor conducts a differential conversion in case that said septenary data is converted into said octonary data so that a vector representing a modulated carrier is prevented from passing a zero point at a time of a phase shift of said modulated carrier.

4. A modulator/demodulator according to claim 2, wherein:
said first convertor converts said binary data into said septenary data in terms of 5 symbols or 31 symbols.

5. A modulator/demodulator according to claim 1, wherein:
said demodulator comprises:
first and second mixers for respectively mixing said second inputted data supplied from said antenna with local carriers with a phase difference of $\pi/2$,
first and second low pass filters for respectively removing high frequency components contained in outputs of said first and second mixers,
an inverse quadrature convertor for demodulating outputs of said first and second low pass filters to derive an octonary data functioning as a 8QAM data,
a third convertor for converting said octonary data outputted from said quadrature demodulator into a septenary data, and
a fourth convertor for converting said septenary data outputted from said third convertor into a binary data.

6. A method of modulation/demodulation used in a modulator/demodulator, comprising:
the first step comprising the steps of converting an inputted data into a septenary data, converting the septenary data into octonary data and converting the octonary data into quadrature data for modulating a carrier, and radiating said modulated carrier via an antenna, and
the second step comprising the steps of demodulating a received data supplied from said antenna via an inverse quadrature converter into a octonary data, and converting said octonary data into a septenary data.

7. A method of modulation/demodulation used in a modulator/demodulator according to claim 6, wherein:
said first step comprises the steps of:
converting said inputted binary data into said septenary data in which each symbol is seven valued,
converting said septenary data into an octonary data in which each symbol is eight valued by adding a dummy to said each seven valued symbol,
conducting a quadrature conversion of said octonary data to derive I and Q components, and
modulating carriers with a phase difference of $\pi/2$ by said I and Q components.

8. A method of modulation/demodulation used in a modulator/demodulator according to claim 7, wherein:
said step of converting said septenary data into an octonary data comprises the step of conducting differential conversion in case that said septenary data is converted into said octonary data so that a vector representing a modulated carrier is prevented from passing a zero point at a time of a phase shift of said modulated carrier.

9. A method of modulation/demodulation used in a modulator/demodulator according to claim 7, wherein:
said step of converting said inputted binary data into said septenary data comprises the step of converting said inputted binary data into said septenary data in terms of 5 symbols or 31 symbols.

10. A method of modulation/demodulation used in a modulator/demodulator according to claim 6, wherein:
said second step comprises the steps of
mixing said received data with local carriers with a phase difference of $\pi/2$ by means of first and second mixers,
removing high frequency components contained in outputs of said first and second mixers,
demodulating output signals of said first and second mixers from which said high frequency components are removed to derive an octonary data functioning as a 8QAM data,
converting said octonary data into a septenary data, and
converting said septenary data into a binary data.

* * * * *